(12) United States Patent
Kitamura et al.

(10) Patent No.: US 7,419,316 B2
(45) Date of Patent: Sep. 2, 2008

(54) DEVELOPING TREATMENT APPARATUS

(75) Inventors: Tetsuya Kitamura, Yasu (JP); Shuuichi Nishikido, Kikuchi-gun (JP)

(73) Assignee: Tokyo Electron Limited, Tokyo-To (JP)

( * ) Notice: Subject to any disclaimer, the term of this patent is extended or adjusted under 35 U.S.C. 154(b) by 152 days.

(21) Appl. No.: 11/243,483

(22) Filed: Oct. 5, 2005

(65) Prior Publication Data
US 2006/0086460 A1   Apr. 27, 2006

(30) Foreign Application Priority Data
Oct. 7, 2004   (JP) .............................. 2004-294827

(51) Int. Cl.
G03B 5/00   (2006.01)
(52) U.S. Cl. ................................. 396/611
(58) Field of Classification Search ............... 396/611, 396/627; 355/27
See application file for complete search history.

(56) References Cited

U.S. PATENT DOCUMENTS

| | | | |
|---|---|---|---|
| 6,012,858 A | 1/2000 | Konishi et al. | |
| 6,159,288 A | 12/2000 | Satou et al. | |
| 6,289,550 B1 * | 9/2001 | Chen et al. | ........... 15/303 |
| 6,332,723 B1 | 12/2001 | Matsuyama et al. | |
| 6,528,128 B2 * | 3/2003 | Ito et al. | ........... 427/512 |
| 6,709,174 B2 | 3/2004 | Yamamoto et al. | |
| 6,877,518 B2 * | 4/2005 | Watanabe et al. | ........ 134/104.4 |

FOREIGN PATENT DOCUMENTS

| | | | |
|---|---|---|---|
| JP | 10340948 | * | 12/1998 |
| JP | 2003100589 | * | 4/2003 |
| JP | 2004-14869 | | 1/2004 |

* cited by examiner

*Primary Examiner*—Della J. Rutledge
(74) *Attorney, Agent, or Firm*—Smith, Gambrell & Russell, LLP

(57) ABSTRACT

A developing treatment apparatus for performing a developing treatment for a substrate, includes a substrate holding member for holding the substrate; an outer peripheral plate surrounding an outer peripheral portion of the substrate to form a gap between the plate and the outer peripheral portion of the substrate; and gas blowout ports for forming a gas flow which flows on a rear face of the substrate from a central portion side of the substrate to the outer peripheral portion side of the substrate, and passes by a lower end portion side of the gap.

27 Claims, 14 Drawing Sheets

DEVELOPING TREATMENT APPARATUS

BACKGROUND OF THE INVENTION

1. Field of the Invention

The present invention relates to a developing treatment apparatus for performing a developing treatment for a substrate.

2. Description of the Related Art

In a photolithography process in a manufacturing process of a semiconductor device, for example, a developing treatment is performed in which, for example, a wafer exposed to light under a predetermined pattern is developed. This developing treatment is usually performed in a developing treatment apparatus in which a developing solution is supplied, for example, to a wafer held on a spin chuck from a developing solution supply nozzle, so that a solution film of the developing solution is formed on the front face of a substrate, for example, a wafer and the wafer is developed. In the developing treatment apparatus, a cleaning solution is then supplied onto the wafer from a cleaning solution supply nozzle while the wafer is being rotated at a high speed to clean the wafer.

However, since the wafer has been rotated at a high speed during the cleaning in the above-described developing treatment apparatus, that apparatus has required a large motor with high torque. Therefore, the developing treatment apparatus has required a large space for the motor and has thus been large in size. In addition, the apparatus has consumed a large quantity of power for rotating the motor, resulting in an increased running cost. To solve the above problem, a proposal can be made, for example, that the wafer be cleaned without rotation.

For example, it has been proposed that the cleaning solution nozzle is brought close to the front face of the wafer to discharge the cleaning solution, and the cleaning solution nozzle is made to scan a plurality of times from one end side to the other end side of the wafer to clean the wafer (Japanese Patent Application Laid-open No. 2004-14869).

However, when the cleaning of the wafer is performed without rotation as described above, the cleaning solution and the developing solution on the wafer front face may run around to the rear face of the wafer because no centrifugal force acts on the wafer, resulting in adherence of the cleaning solution or the developing solution to the rear face of the wafer. If the cleaning solution or the developing solution adheres to the rear face of the wafer, the adhered matter dries to become a cause of particles.

SUMMARY OF THE INVENTION

The present invention has been developed in consideration of the above point, and its object is to prevent liquid such as a developing solution or a cleaning solution on the front face side of a substrate such as a wafer from running around to the rear face side of the substrate to contaminate the rear face of the substrate.

To attain the above object, the present invention is a developing treatment apparatus for performing a developing treatment for a substrate, including: a substrate holding member for holding the substrate; an outer peripheral plate surrounding an outer peripheral portion of the substrate held on the substrate holding member to form a gap between the plate and the outer peripheral portion of the substrate; and gas blowout ports for forming a gas flow which flows on a rear face of the substrate held on the substrate holding member, from a central portion side of the substrate to the outer peripheral portion side of the substrate, and passes by a lower end portion side of the gap.

According to the present invention, the outer peripheral plate is provided that surrounds the outer peripheral portion of the substrate while creating the gap between the plate and the outer peripheral portion of the substrate, so that the gap is the only one passage where the liquid on the substrate can flow along the outer peripheral portion of the substrate to run around to the rear face side, resulting in a reduced amount of the liquid running around. As a matter of course, the gap is formed between the outer peripheral portion of the substrate and the outer peripheral plate, so that the substrate holding member can hold the substrate without interference from the outer peripheral plate. Even if there is a small amount of liquid leaking through the gap, this liquid can be swept outward to the outer peripheral plate side using the gas blowout ports, whereby the liquid can be prevented from running around to the rear face side of the substrate.

The gap between the outer peripheral plate and the outer peripheral portion of the substrate may have a width set such that a liquid which has passed through the gap from a front face side of the substrate flows along a rear face of the outer peripheral plate. In other words, it is also possible that the gap between the outer peripheral plate and the outer peripheral portion of the substrate is set small to make the surface tension of the liquid to the outer peripheral plate relatively large with respect to the force of dropping downward of the liquid which has passed through the gap, in order that the liquid which has passed through the gap is swept outward by the gas flow from the gas blowout ports to flow along the rear face side of the outer peripheral plate. This can more surely prevent the liquid from running around to the rear face side of the substrate.

A rear face of the outer peripheral plate may have been subjected to hydrophilic treatment. This makes the liquid, which has passed through the gap between the outer peripheral portion of the substrate and the outer peripheral plate, easily flow to the rear face side of the outer peripheral plate.

The gas blowout ports may be formed to blow out a gas in an obliquely upward direction which is a direction inclined from the upward direction toward the outer peripheral portion side of the substrate. In this case, the gas blown out from the gas blowout ports flows as it is to the outer peripheral portion side of the substrate and thereby can form a smooth flow flowing from the central portion side of the substrate to the outer peripheral portion side of the substrate. Note that the gas blowout ports may be formed to blow the gas directly to the outer peripheral portion of the substrate.

The gas blowout ports may be formed in multiple rows concentrically on the rear face side of the substrate. In this case, the gas blowout ports of an outer row of the gas blowout ports of the multiple rows may be formed to blow the gas directly to the outer peripheral portion of the substrate.

The apparatus may further include a raising and lowering drive unit for raising and lowering the outer peripheral plate. In this case, the outer peripheral plate can be adjusted in height to, for example, a position where the liquid passing through the gap between the outer peripheral plate and the outer peripheral portion of the substrate flows easiest along the rear face of the outer peripheral plate.

A rear face of the outer peripheral plate may be inclined in a manner to gradually lower to the outside from a portion forming the lower end portion of the gap. In this case, the liquid which has passed through the gap easily flows along the inclined rear face.

A flow path may be formed on the rear face side of the substrate that allows a gas blown out from the gas blowout ports to flow along the rear face of the substrate and a rear face of the outer peripheral plate. In this case, all the gas blown out from the gas blowout ports passes through the lower end portion side of the gap without diffusion, so that the gas can effectively sweep away the liquid to the outer peripheral plate side.

A front face of the outer peripheral plate may be placed flush with a front face of the substrate held on the substrate holding member. In this case, the developing solution can be applied also to the front face of the outer peripheral plate wider than the front face of the substrate. This prevents the developing solution from dripping down from the outer peripheral portion of the substrate to form a flow of the developing solution on the front face of the substrate during development, resulting in an appropriate development on the front face of the substrate without unevenness.

The front face of the outer peripheral plate may have been subjected to hydrophobic treatment. This prevents the developing solution applied also on the front face of the outer peripheral plate from diffusing to the outside and dripping down from the end portion of the outer peripheral plate. As a result of this, the developing solution on the front face of the substrate can be completely kept standstill.

According to the present invention, contamination of the rear face of the substrate can be prevented, whereby occurrence of particles is avoided to prevent a decrease in yields due to adherence of such particles to the front face of the substrate.

DETAILED DESCRIPTION OF THE INVENTION

Figure 1:
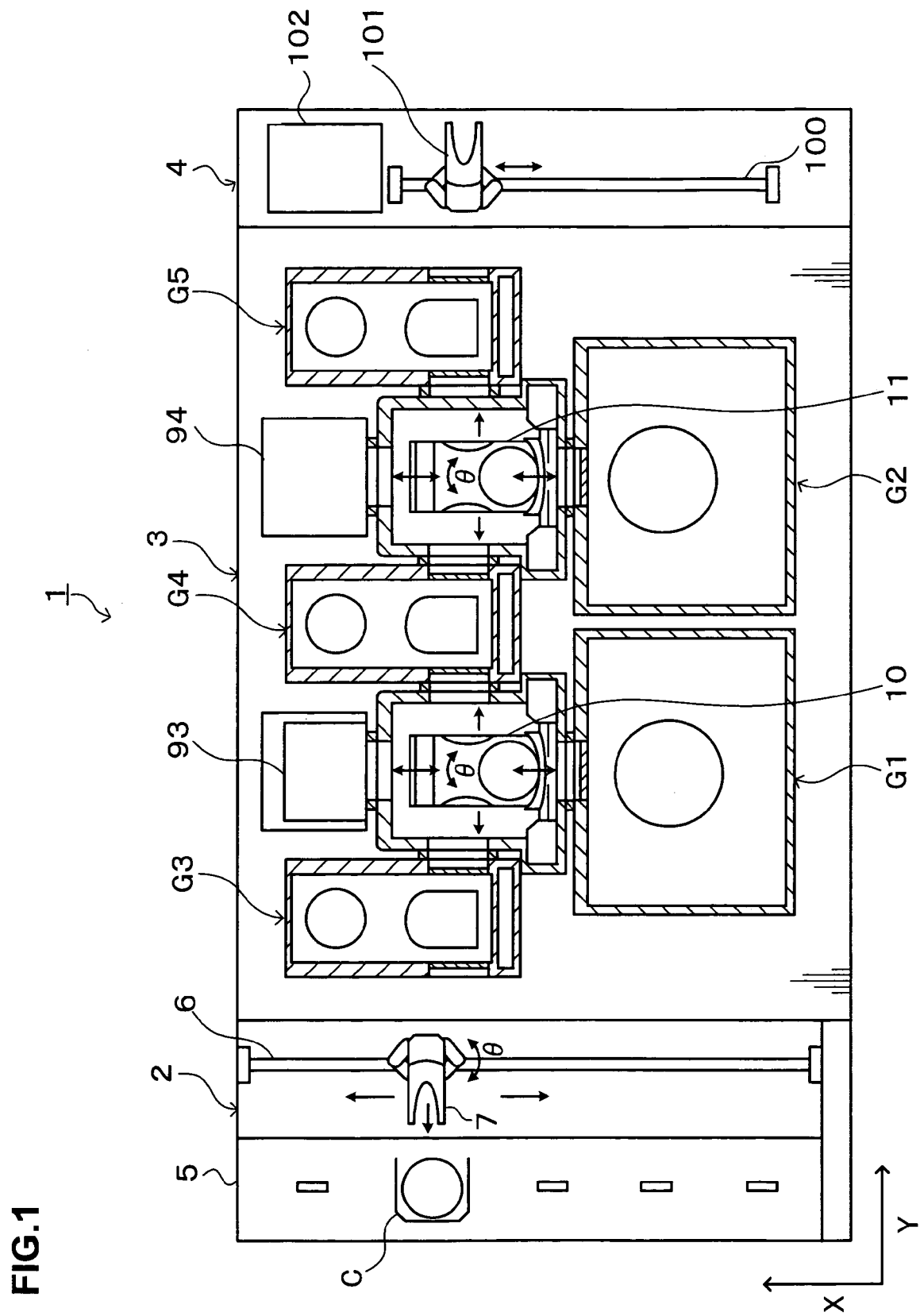
FIG. 1 is a plan view showing a schematic configuration of a coating and developing treatment system incorporating a developing treatment unit according to the embodiment.
Figure 2:
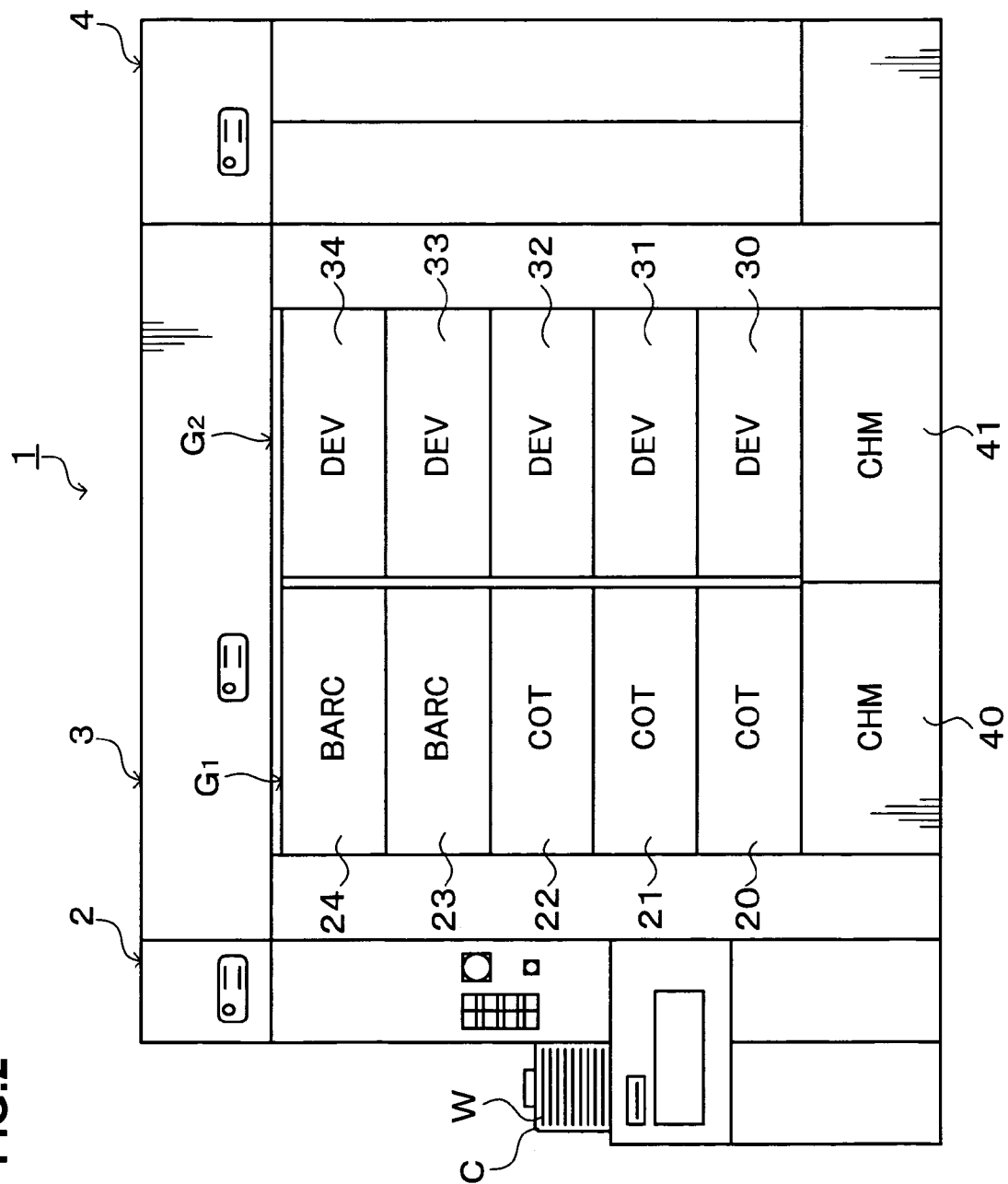
FIG. 2 is a front view of the coating and developing treatment system in FIG. 1.
Figure 3:
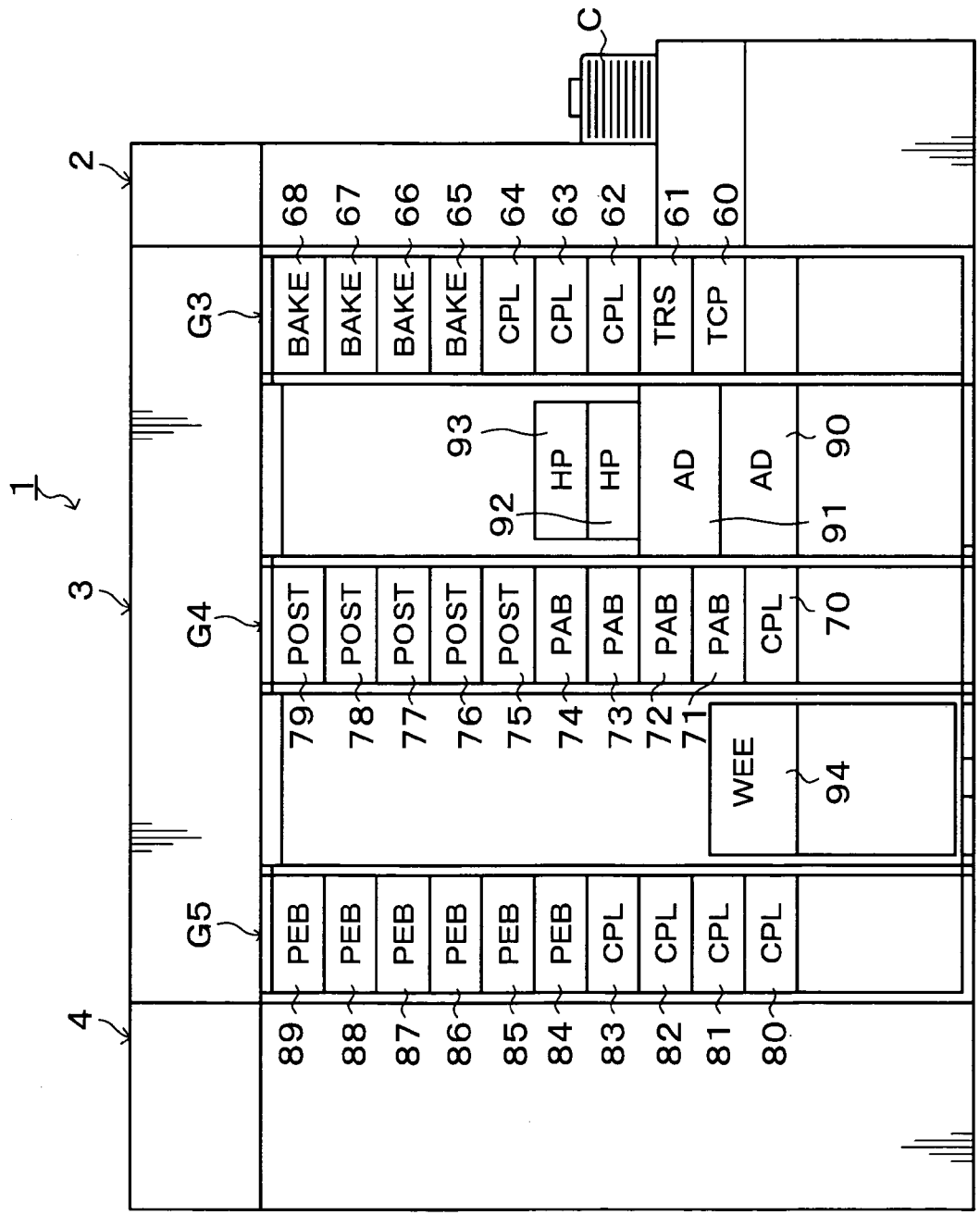
FIG. 3 is a rear view of the coating and developing treatment system in FIG. 1.

Hereinafter, a preferred embodiment of the present invention will be described. FIG. 1 is a plan view showing a schematic configuration of a coating and developing treatment system 1 incorporating a developing treatment unit (apparatus) according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for carrying, for example, 25 wafers W per cassette as a unit from/to the outside into/from the coating and developing treatment system 1 and carrying the wafers W into/out of a cassette C; a processing station 3 including various kinds of processing and treatment units, which are multi-tiered, for performing predetermined processing or treatments in a manner of single wafer processing in a photolithography process; and an interface section 4 for passing the wafers W to/from a not-shown aligner provided adjacent to the processing station 3, are integrally connected together.

In the cassette station 2, a plurality of cassettes C can be mounted at predetermined positions on a cassette mounting table 5 in a line in an X-direction (a top-to-bottom direction in FIG. 1). A wafer carrier 7 movable in the X-direction on a carrier path 6 is provided in the cassette station 2. The wafer carrier 7 is also movable in a wafer-arrangement direction of the wafers W housed in the cassette C (a Z-direction; the vertical direction), and thus can selectively access the wafers W in each of the cassettes C arranged in the X-direction.

The wafer carrier 7 is rotatable in a θ-direction around a Z-axis to be able to also access a later-described temperature regulating unit 60 and a transition unit 61 included in a third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction (the downward direction in FIG. 1) in the X-direction in the processing station 3, the first processing unit group G1 and the second processing unit group G2 are placed in that order from the cassette station 2 side. On the side of the positive direction (the upward direction in FIG. 1) in the X-direction in the processing station 3, the third processing unit group G3, the fourth processing unit group G4, and the fifth processing unit group G5 are placed in that order from the cassette station 2 side. Between the third processing unit group G3 and the fourth processing unit group G4, a first carrier unit 10 is provided. The first carrier unit 10 can selectively access the processing and treatment units in the first processing unit group G1, the third processing unit group G3, and the fourth processing unit group G4 and carry the wafer W to them. Between the fourth processing unit group G4 and the fifth processing unit group G5, a second carrier unit 11 is provided. The second carrier unit 11 can selectively access the processing and treatment units in the second processing unit group G2, the fourth processing unit group G4, and the fifth processing unit group G5 and carry the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W and bottom coating units 23 and 24 each for forming an anti-reflection film that prevents reflection of light during exposure processing, are five-tiered in order from the bottom. In the second processing unit group G2, solution treatment units, for example, developing treatment units 30 to 34 according to the present invention are five-tiered in order from the bottom. Further, chemical chambers 40 and 41 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for temperature-regulating the wafer W under temperature control with a high precision, and high-temperature thermal processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after the resist coating treatment, and post-baking units 75 to 79 each for heat-processing the wafer W after the developing treatment, are ten-tiered in order from the bottom.

In the fifth processing unit group G5, a plurality of thermal processing units each for performing thermal processing for the wafer W, for example, high-precision temperature regulating units 80 to 83, and post-exposure baking units 84 to 89 each for heat-processing the wafer W after exposure, are ten-tiered in order from the bottom.

As shown in FIG. 1, the plurality of processing and treatment units are arranged on the positive direction side in the X-direction of the first carrier unit 10, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, on the positive direction side in the X-direction of the second carrier unit 11, for example, an edge exposure unit 94 is disposed which selectively exposes only the edge portion of the wafer W to light.

In the interface section 4, for example, a wafer carrier 101 moving on a carrier path 100 extending in the X-direction and a buffer cassette 102 are provided as shown in FIG. 1. The wafer carrier 101 is movable in the Z-direction and also rotatable in the θ-direction and can access the not-shown aligner adjacent to the interface section 4, the buffer cassette 102, and the processing unit group G5 and carry the wafer W to each of them.

Figure 4:
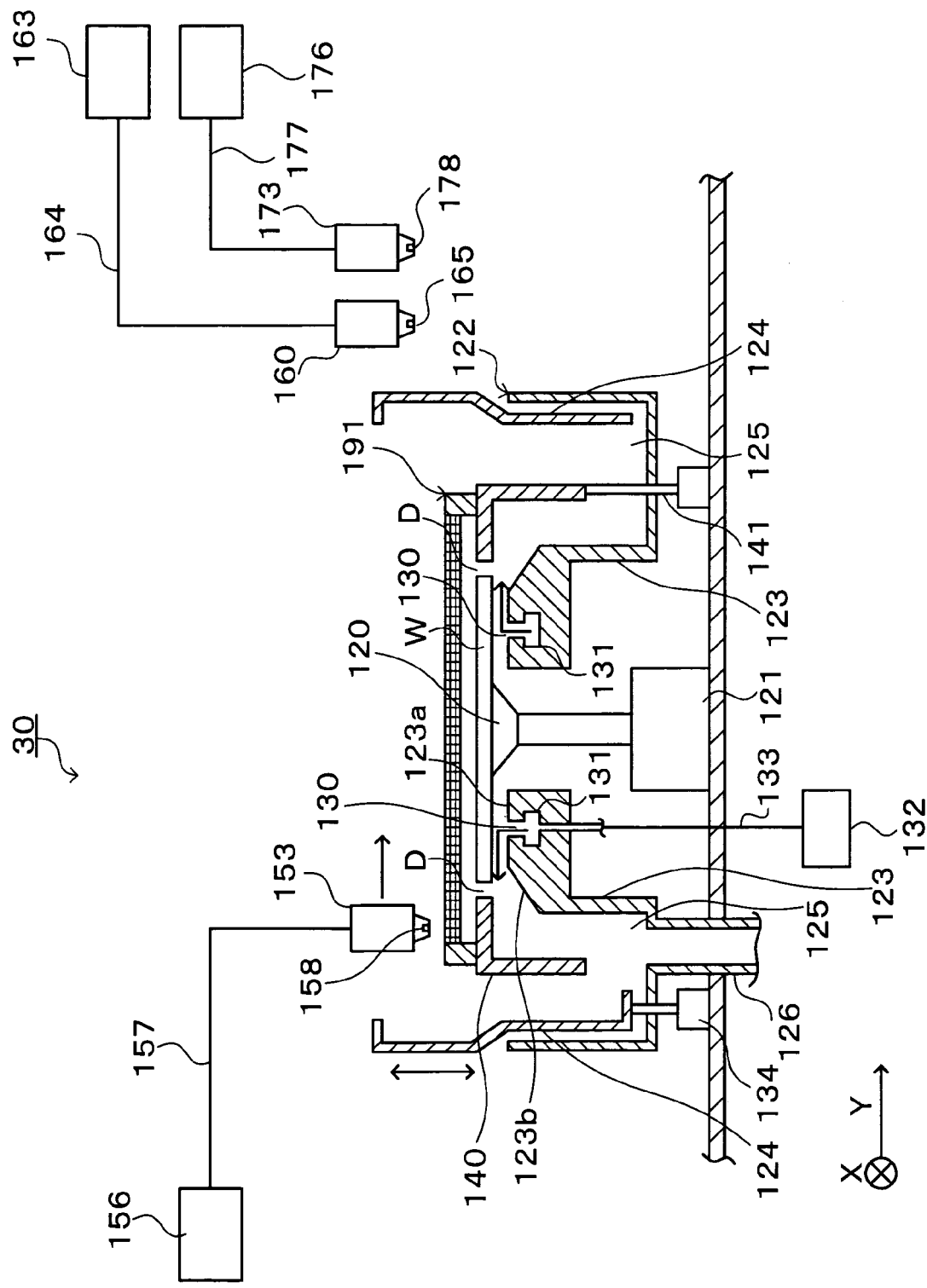
FIG. 4 is an explanatory view of a longitudinal section showing a schematic configuration of the developing treatment unit according to the embodiment.
Figure 5:
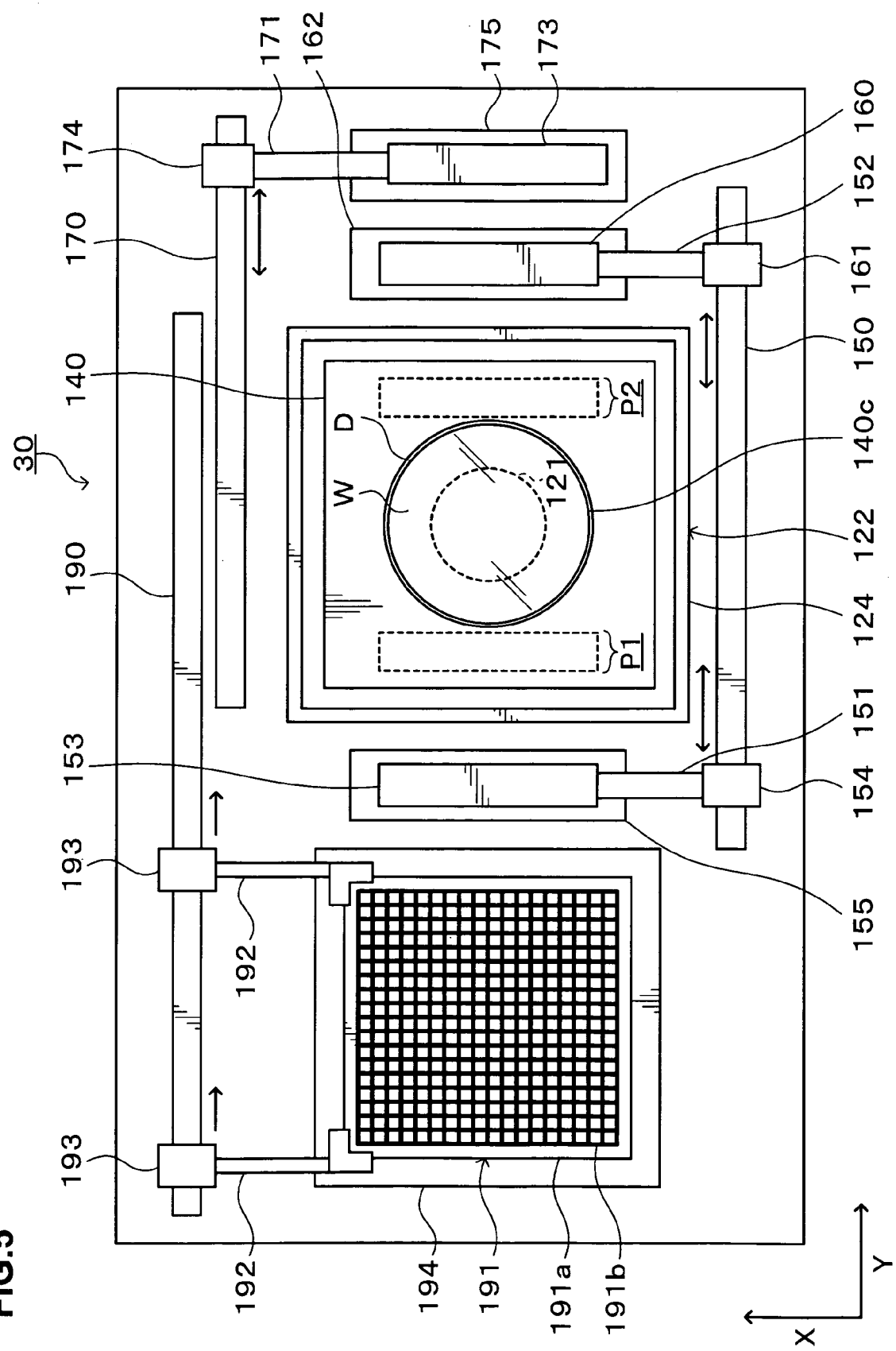
FIG. 5 is a plan view showing a schematic configuration of the developing treatment unit according to the embodiment.

Next, the configuration of the developing treatment unit 30 will be described in detail. FIG. 4 is an explanatory view of a longitudinal section showing a schematic configuration of the developing treatment unit 30, and FIG. 5 is a plan view showing a schematic configuration of the developing treatment unit 30.

As shown in FIG. 4, the developing treatment unit 30 includes at its central portion a chuck 120 as a substrate holding member for holding the wafer W thereon. The chuck 120 has a horizontal upper surface which is provided with, for example, a suction hole (not shown) for sucking the wafer W. By suction through the suction hole, the wafer W can be sucked onto the chuck 120.

The chuck 120 can move up and down by a chuck drive mechanism 121 composed of a drive unit, for example, such as a cylinder.

Around the chuck 120, for example, a cup 122 is provided that receives and recovers liquid splashing or dropping down from the wafer W. The cup 122 includes, for example, an inner cup 123 surrounding the periphery of the chuck 120 and an outer cup 124 surrounding the outside of the inner cup 123. Between the inner cup 123 and the outer cup 124, a collecting portion 125 is formed into which the recovered liquid is collected. To the bottom of the collecting portion 125, a drain pipe 126 is connected that communicates with, for example, a drain section of a factory so that the liquid recovered by the cup 122 can be drained to the outside of the developing treatment unit 30 through the drain pipe 126.

Figure 6:
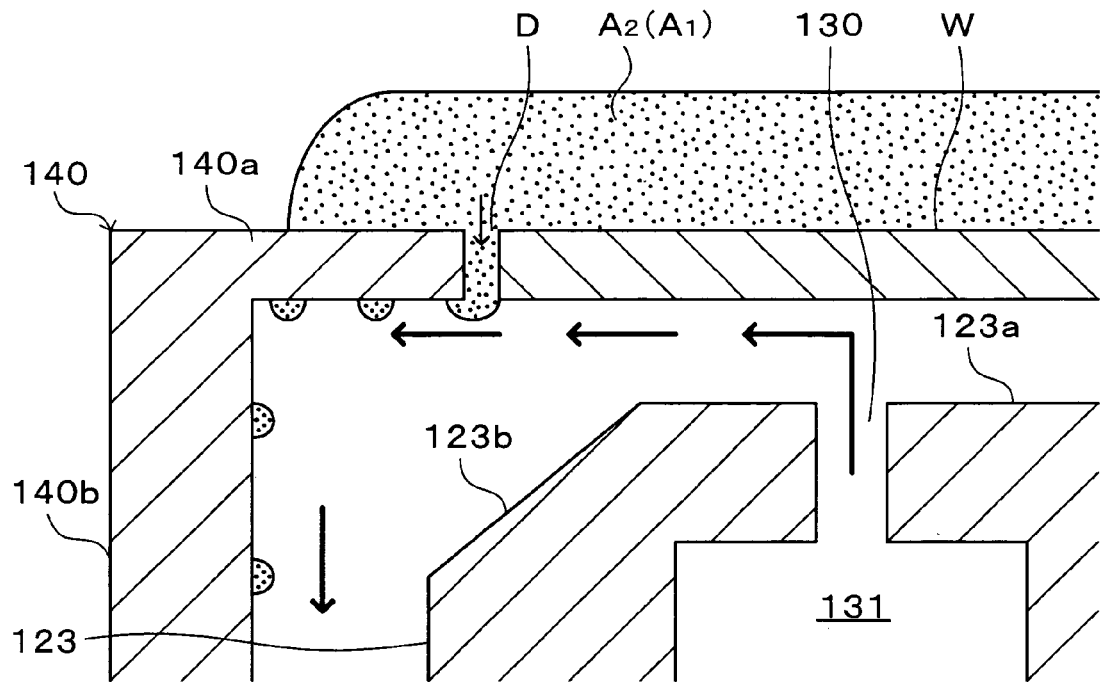
FIG. 6 is an explanatory view of a longitudinal section showing a configuration of an inner cup and an outer peripheral plate.
Figure 7:
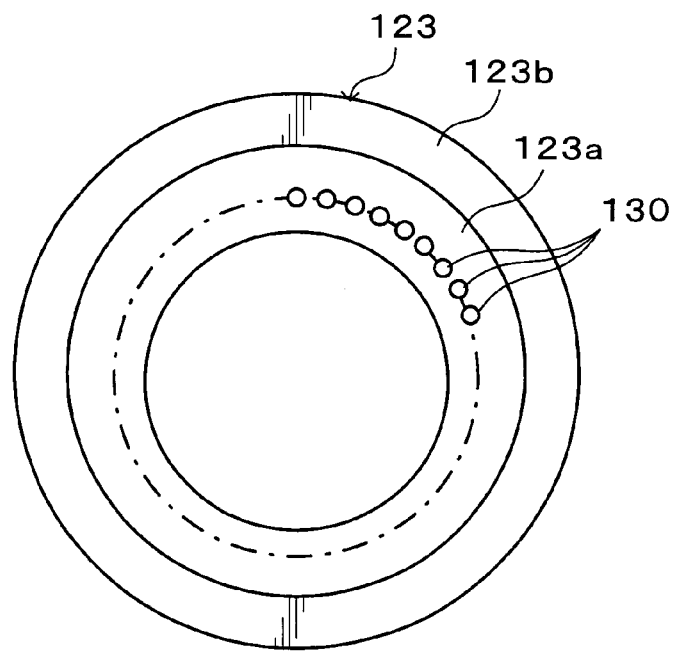
FIG. 7 is a plan view of the inner cup.

The inner cup 123 is formed in, for example, an almost cylindrical shape. The upper surface of the inner cup 123 opposed to the rear face of the wafer W held on the chuck 120 is formed with, for example, a horizontal surface 123a which is parallel to the rear face of the wafer W and an inclined surface 123b which gradually lowers toward the outside from the outside end portion of the horizontal surface 123a as shown in FIG. 4 and FIG. 6. The horizontal surface 123a of the inner cup 123 is formed with gas blowout ports 130 for blowing gas upward. The gas blowout ports 130 are formed, as shown in FIG. 7, at a plurality of positions at regular intervals on the same circumference and circularly arranged on the horizontal surface 123a of the inner cup 123. The gas blowout ports 130 have a diameter of about, for example, 1 mm and are formed at 6 degree intervals of a center angle at 60 positions in total on the horizontal surface 123a.

Each of the gas blowout ports 130 communicates with a buffer 131 formed inside the inner cup 123 in a ring shape as shown in FIG. 4. To the buffer 131, a gas supply pipe 133 is connected which communicates with a gas supply source 132 located, for example, outside the developing treatment unit 30. In this embodiment, the gas supply source 132 stores air which is blown from the gas blowout ports 130. This configuration allows the air which has been uniformed in pressure in the buffer 131 to be blown out from the gas blowout ports 130 evenly toward the rear face of the wafer W to thereby form a gas flowing outward along the rear face of the wafer W.

The outer cup 124 is formed, for example, in a shape of a tube in an almost square as seen in a plan view as shown in FIG. 5. The outer cup 124 can move up and down, for example, by means of a raising and lowering drive unit 134 such as a cylinder as shown in FIG. 4.

Between the inner cup 123 and the outer cup 124 and outside the wafer W held on the chuck 120, an outer peripheral plate 140 is provided which is formed to surround the outer peripheral portion of the wafer W. The outer peripheral plate 140 is supported, for example, by a supporting member 141. The outer peripheral plate 140 is composed of a horizontal portion 140a located, for example, flush with the wafer W held on the chuck 120, and a vertical portion 140b formed downward from the outside end portion of the horizontal portion 140a.

Figure 8:
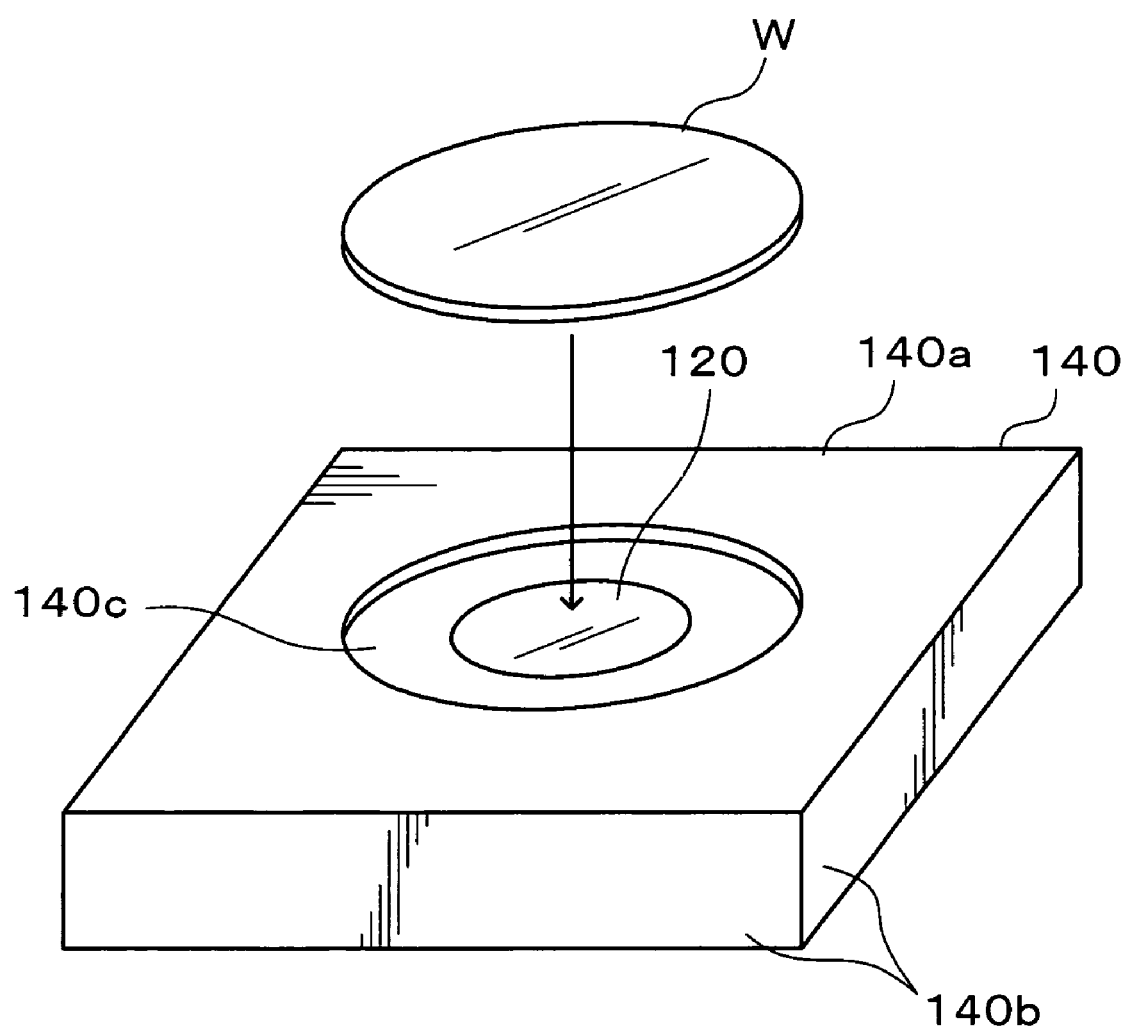
FIG. 8 is a perspective view for explaining the configuration of the outer peripheral plate.

The horizontal portion 140a is formed such that its outer edge is formed in a rectangle larger than the wafer W as seen in a plan view as shown in FIG. 5 and FIG. 8, and is formed with an opening portion 140c at its central portion for the wafer W to be held on the chuck 120. The thickness of the horizontal portion 140a is, for example, almost the same as the thickness of the wafer W, for example, about 0.5 mm. Incidentally, it is also possible to make only the portion near the inner peripheral portion of the horizontal portion 140a as thick as the wafer W and make the other portion thicker than the wafer W.

Between the horizontal portion 140a and the wafer W, a gap D with a predetermined width is created. The gap D is set to have a width such that liquid accumulated on the wafer W and the horizontal portion 140a never drops down through the gap solely due to its own weight because of its surface tension and even if the liquid on the wafer W passes through the gap by increase in weight, the liquid flows along the rear face of the horizontal portion 140a from the effect of a gas flow from the gas blowout ports 130. The gap D is set to, for example, about 0.1 mm to about 0.5 mm, preferably about 0.25 mm.

The front face of the horizontal portion 140a is flush with the front face of the wafer W held on the chuck 120. The front face of the horizontal portion 140a is coated with a resin or the like such as polyethylene, polypropylene, Teflon (registered trademark of Du Pont) for hydrophobic treatment. This ensures that when a solution film of the developing solution is formed on the wafer W and the horizontal portion 140a, the developing solution is prevented from diffusing outward on the horizontal portion 140a. The rear face of the horizontal portion 140a has been subjected to hydrophilic treatment, for example, by blasting the plasma processing or UV processing. This allows the liquid which has passed through the gap D to easily run around to the rear face of the horizontal portion 140a.

The vertical portion 140b is formed toward the collecting portion 125 between the inner cup 123 and the outer cup 124. This ensures that the liquid flowing along the rear face of the horizontal portion 140a is guided to the collecting portion 125 via the vertical portion 140b. Note that the inside of the vertical portion 140b has also been subjected to hydrophilic treatment similarly to the rear face of the horizontal potion 140a.

As shown in FIG. 5, on the side of the negative direction (the downward direction in FIG. 5) in the X-direction of the cup 122, a first rail 150 is formed that extends along the Y-direction (the right-to-left direction in FIG. 5). The first rail 150 is formed, for example, from the outside on the side of the negative direction (the left direction in FIG. 5) in the Y-direction of the cup 122 to the outside on the side of the positive direction (the right direction in FIG. 5) in the Y-direction of the cup 122. To the first rail 150, for example, two arms 151 and 152 are attached. The first arm 151 supports a developing solution supply nozzle 153. The first arm 151 can move in the Y-direction on the first rail 150 by means of, for example, a nozzle drive unit 154. The first arm 151 allows the developing solution supply nozzle 153 to move from a nozzle waiting portion 155 which is located outside the cup 122 on the negative direction side in the Y-direction to the inside of the cup 122 to thereby move above the front face of the wafer W. The first arm 151 can also move in the top-to-bottom direction, for example, by means of the nozzle drive unit 154 to raise and lower the developing solution supply nozzle 153.

The developing solution supply nozzle 153 has an elongated shape along the X-direction having a dimension, for example, the same as or longer than that of the diameter of the wafer W. As shown in FIG. 4, to the upper portion of the developing solution supply nozzle 153, a developing solution supply pipe 157 is connected which communicates with a developing solution supply source 156. The lower portion of the developing solution supply nozzle 153 has a plurality of discharge ports 158 formed, for example, in a line along its longitudinal direction. The developing solution supply nozzle 153 allows the developing solution introduced from the developing solution supply pipe 157 at the upper portion to flow through the inside of the developing solution supply nozzle 153 and to be discharged uniformly from the discharge ports 158 at the lower portion.

The second arm 152 supports a cleaning solution supply nozzle 160 as shown in FIG. 5. The second arm 152 can move in the Y-direction on the first rail 150 by means of, for example, a nozzle drive unit 161. The second arm 152 allows the cleaning solution supply nozzle 160 to move from a nozzle waiting portion 162 provided on the outside of the cup 122 on the positive direction side in the Y-direction to the inside of the cup 122 to thereby move above the front face of the wafer W. The second arm 152 can also move in the top-to-bottom direction by means of the nozzle drive unit 161.

The cleaning solution supply nozzle 160 has an elongated shape along the X-direction having a dimension, for example, the same as or longer than that of the diameter of the wafer W. As shown in FIG. 4, to the upper portion of the cleaning solution supply nozzle 160, a cleaning solution supply pipe 164 is connected which communicates with a cleaning solution supply source 163. In this embodiment, the cleaning solution supply source 163 stores pure water so that the pure water is supplied to the cleaning solution supply nozzle 160 as the cleaning solution. The lower portion of the cleaning solution supply nozzle 160 has a plurality of discharge ports 165 for discharging the cleaning solution formed, for example, linearly along its longitudinal direction. The plurality of discharge ports 165 are formed from one end portion to the other end portion in the longitudinal direction of the cleaning solution supply nozzle 160. The cleaning solution supply nozzle 160 allows the cleaning solution introduced from the cleaning solution supply pipe 164 at the upper portion to pass through the inside of the cleaning solution supply nozzle 160 and to be discharged uniformly from the discharge ports 165 at the lower portion.

As shown in FIG. 5, on the side of the positive direction (the upward direction in FIG. 5) in the X-direction of the cup 122, a second rail 170 is formed that extends along the Y-direction (the right-to-left direction in FIG. 5). The second rail 170 is formed, for example, from the outside of the cup 122 on the positive direction side in the Y-direction to the position near the end portion of the cup 122 on the negative direction side in the Y-direction. To the second rail 170, for example, a third arm 171 is attached. The third arm 171 supports a drying gas jet nozzle 173. The third arm 171 can move in the Y-direction on the second rail 170 by means of, for example, a nozzle drive unit 174. The third arm 171 allows the drying gas jet nozzle 173 to move from a nozzle waiting portion 175 located on the outside of the cup 122 on the positive direction side in the Y-direction to the inside of the cup 122 to thereby move above the front face of the wafer W. The third arm 171 can also move in the top-to-bottom direction, for example, by means of the nozzle drive unit 174 to raise and lower the drying gas jet nozzle 173.

The drying gas jet nozzle 173 has an elongated shape along the X-direction having a dimension, for example, the same as or longer than that of the diameter of the wafer W. As shown in FIG. 4, to the upper portion of the drying gas jet nozzle 173, a gas supply pipe 177 is connected which communicates with a drying gas supply source 176. In this embodiment, the drying gas supply source 176 is filled with air so that the air is supplied to the drying gas jet nozzle 173 as the drying gas. The lower portion of the drying gas jet nozzle 173 is formed with a gas jet port 178 in a shape of slit which extends from one end portion to the other end portion in its longitudinal direction. The drying gas jet nozzle 173 is configured to allow the air introduced from the air supply pipe 177 at the upper portion to flow through the inside of the drying gas jet nozzle 173 and to be jetted from the gas jet port 178 at the lower portion.

As shown in FIG. 5, on the positive direction side in the X-direction of the cup 122, a third rail 190 is provided that extends along the Y-direction. The third rail 190 is provided, for example, from the end portion of the cup 122 on the positive direction side in the Y-direction to the outside of the cup 122 on the negative direction side in the Y-direction. To the third rail 190, for example, holding arms 192 are attached that hold, for example, a mesh member 191. The holding arms 192 can freely move on the third rail 190 by means of, for example, arm drive units 193. The holding arms 192 allow the mesh member 191 to move from a mesh member waiting portion 194 located outside the nozzle waiting portion 155 on the negative direction side in the Y-direction to a position above the wafer W inside the cup 122. The holding arms 192 can also move in the top-to-bottom direction, for example, by means of the arm drive units 193 to raise and lower the mesh member 191.

The mesh member 191 has an outer edge, for example, in a square shape larger than the wafer W and smaller than the outer peripheral plate 140 as seen in the plan view, and is composed of an outer frame portion 191a formed along the outer peripheral portion of the mesh member 191 and a mesh portion 191b formed in a plane shape inside the outer frame portion 191a. The outer frame portion 191a projects downward to be lower than the lower surface of the mesh member 191 so as to create a gap with a predetermined width between the mesh portion 191b and the wafer front face when the outer frame portion 191a is mounted on the outer peripheral plate 140. The mesh portion 191b is configured such that, for example, fine linear members are arranged in a lattice form. The linear members constituting the mesh portion 191b are formed of a material such as a resin excellent in hydrophilicity. The mesh member 191 is mounted on the outer peripheral plate 140, and the developing solution is supplied from above the mesh member 191 and made to pass through the mesh portion 191b, whereby flow of the developing solution supplied on the wafer W can be suppressed, resulting in formation of a solution film without flow and with a uniform thickness on the wafer W.

The configurations of the developing treatment units 31 to 34 other than the developing treatment unit 30 are the same as that of the developing treatment unit 30, and the description thereof is omitted.

Next, processes in the photolithography process performed in the coating and developing treatment system 1 configured as described above will be described.

First, one unprocessed wafer W is taken out of the cassette C on the cassette mounting table 5 by the wafer carrier 7 and carried to the temperature regulating unit 60 included in the third processing unit group G3. The wafer W carried to the temperature regulating unit 60 is temperature-regulated to a predetermined temperature, and is then carried by the first carrier unit 10 into the bottom coating unit 23 where the wafer is formed with an anti-reflection film. The wafer W formed with the anti-reflection film is sequentially carried by the first carrier unit 10 to the heating unit 92, the high-temperature thermal processing unit 65, and the high-precision temperature regulating unit 70 so that predetermined processing is performed in each of the units. Thereafter, the wafer W is carried to the resist coating unit 20 where the wafer W is formed with a resist film thereon, and then carried by the first carrier unit 10 to the pre-baking unit 71 and subsequently carried by the second carrier unit 11 to the edge exposure unit 94 and the high-precision temperature regulating unit 83 so that the wafer W is subjected to predetermined processing in each of the units.

Thereafter, the wafer W is carried by the wafer carrier 101 in the interface section 4 to the not-shown aligner where the wafer W is exposed to light. The wafer W for which exposure processing has been finished is carried by the wafer carrier 101, for example, to the post-exposure baking unit 84 where the wafer W is subjected to heating processing, and is then carried by the second carrier unit 11 to the high-precision temperature regulating unit 81 where the wafer W is temperature-regulated. The wafer W is then carried to the developing treatment unit 30 where the resist film on the wafer W is developed. The wafer W is then carried by the second carrier unit 11 to the post-baking unit 75 where the wafer W is subjected to heating processing, and is then carried to the high-precision temperature regulating unit 63 where the wafer W is temperature-regulated. The wafer W is then carried by the first carrier unit 10 to the transition unit 61 and returned by the wafer carrier 7 to the cassette C to complete a series of photolithography processes.

Figure 9A:
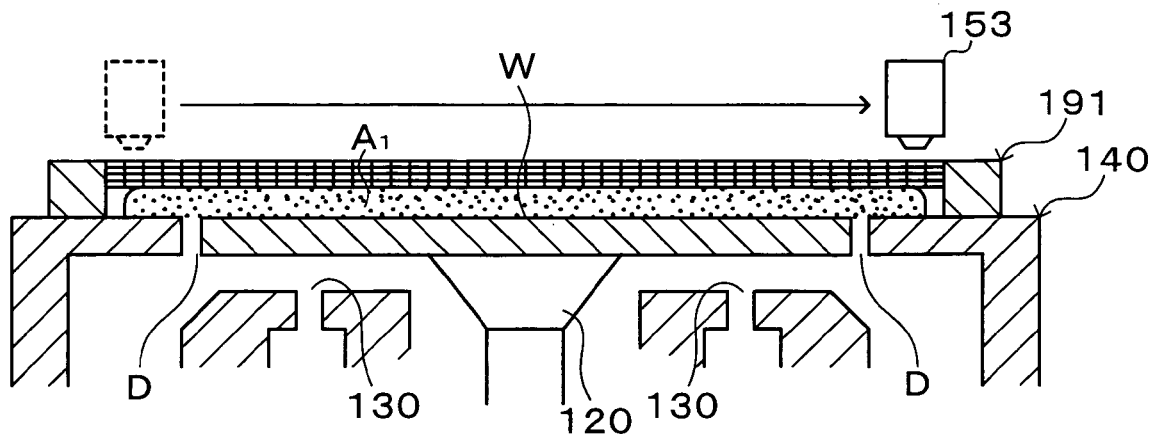
FIGS. 9A to 9C are explanatory illustrations of a flow of a developing treatment, FIG. 9A showing a state in which a developing solution supply nozzle has moved to the end portion above a wafer W, FIG. 9B showing a state in which the developing solution supply nozzle has returned to the initial position, and FIG. 9C showing a state in which a drying gas jet nozzle is moving above the wafer.
Figure 9B:
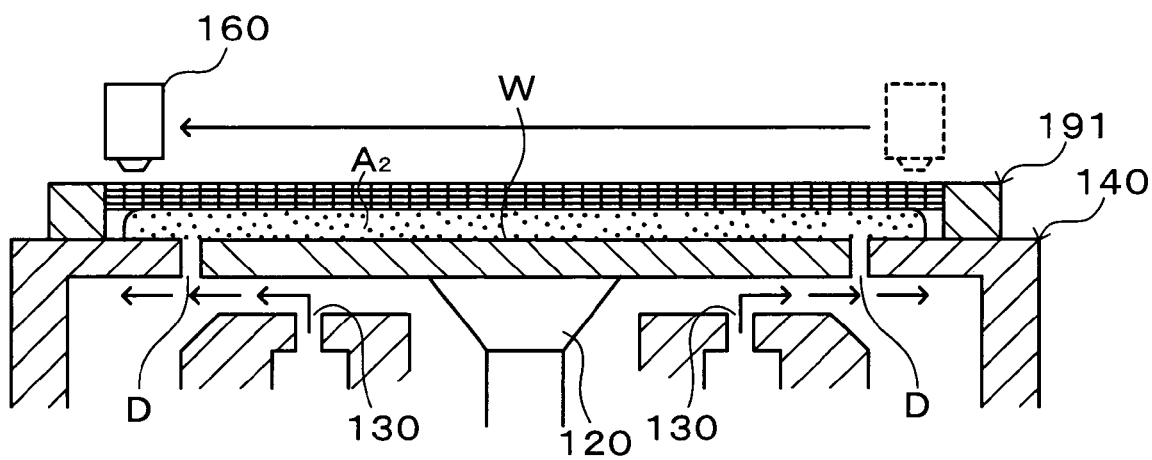
Figure 9C:
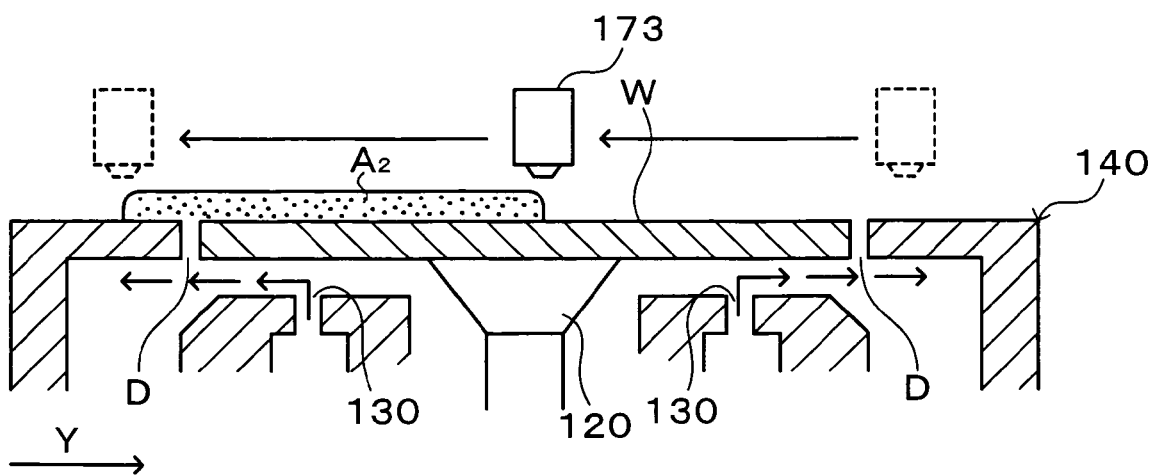

Next, the developing treatment performed in the above-described developing treatment unit 30 will be described in detail. FIGS. 9A to 9C are flow illustrations for explaining the process of the developing treatment. The wafer W carried into the developing treatment unit 30 is first held on the chuck 120 by suction as shown in FIG. 4 and placed flush with the outer peripheral plate 140. The mesh member 191 waiting at the mesh member waiting portion 194 is subsequently moved to a position above the outer peripheral plate 140 inside the cup 122 by the holding arms 192 and then mounted on the outer peripheral plate 140. Next, the developing solution supply nozzle 153 waiting at the nozzle waiting portion 155 is moved by means of the first arm 151 to a position P1 (a dotted line portion in FIG. 5) in front of the end portion of the wafer W in the cup 122 on the negative direction side in the Y-direction as seen in the plan view and brought close to the upper surface of the mesh member 191. During the movement, the blowout of gas from the gas blowout ports 130 to the rear face side of the wafer W is stopped.

Thereafter, the developing solution is discharged from the developing solution supply nozzle 153, and the developing solution supply nozzle 153 moves along the front face of the mesh member 191 to a position P2 (shown by a dotted line portion in FIG. 5) outside the end of the wafer W on the positive direction side in the Y-direction while discharging a developing solution A1 (FIG. 9A). Thereby, the developing solution A1 is supplied onto the front face of the wafer W and the front face of the outer peripheral plate 140 therearound through the mesh member 191, so that a solution film of the developing solution A1 is formed. Then, development of the wafer front face is started and thereby the wafer W is subjected to standstill development for a predetermined period. Since the developing solution A1 never leaks through the gap D between the wafer W and the outer peripheral plate 140 during the development, the blowout of gas from the gas blowout ports 130 to the rear face side of the wafer W is stopped. The developing solution supply nozzle 153 after finish of the supply of the developing solution A1 is returned to the nozzle waiting portion 155. Note that gas may be blown out from the gas blowout ports 130 to form a gas flow on the rear face side of the wafer W during the development.

After finish of the standstill development for a predetermined period, the cleaning solution supply nozzle 160 waiting, for example, at the nozzle waiting portion 162 is moved by means of the second arm 152 to the position P2 in front of the end portion of the wafer W on the positive direction side in the Y-direction as seen in the plan view and brought close to the front face of the mesh member 191. During the movement, blowout of gas from the gas blowout ports 130 to the rear face side of the wafer W is started to form a gas flow flowing along the rear face of the wafer W from the central portion of the wafer W toward the outer peripheral portion. Thereafter, pure water is discharged as a cleaning solution A2 from the cleaning solution supply nozzle 160, and the cleaning solution supply nozzle 160 moves along the front face of the mesh member 191 to the position P1 outside the end of the wafer W on the negative direction side in the Y-direction while discharging the cleaning solution A2 (FIG. 9B). Thereby, the pure water is supplied onto the front face of the wafer W through the mesh member 191, so that the developing solution A1 on the wafer front face is replaced with the cleaning solution A2, whereby the wafer front face is cleaned. A potion of the developing solution A1 or cleaning solution A2 may leak through the gap D between the outer peripheral plate 140 and the outer peripheral portion of the wafer W during the cleaning, but the leaked liquid is swept outward by the gas flow from the gas blowout ports 130 at the lower end portion of the gap D as shown in FIG. 6 and drained into the cup 122 after flowing along the rear face of the outer peripheral plate 140 due to the surface tension of the liquid itself. It should be noted that in the case where only one time scan by the cleaning solution supply nozzle 160 is not enough to replace with the cleaning solution A2, the cleaning solution supply nozzle 160 discharging the cleaning solution A2 may be reciprocated a plurality of times during which the blowout of gas from the gas blowout ports 130 is continuously performed.

After the developing solution A1 on the wafer W is replaced with the cleaning solution A2, the cleaning solution supply nozzle 160 is returned to the nozzle waiting portion 162. Thereafter, the mesh member 191 is returned by the holding arms 192 to the mesh member waiting portion 194. During the movement, the blowout of gas from the gas blowout ports 130 is also continued so that the liquid leaked through the gap D is swept toward the rear face of the outer peripheral plate 140 and drained.

After the mesh member 190 has evacuated from the position above the wafer W, the drying gas jet nozzle 173 waiting at the nozzle waiting portion 175 is moved by means of the third arm 171 to the position P2 in front of the end portion of the wafer W on the positive direction side in the Y-direction as seen in the plan view and brought close to the wafer front face. Thereafter, air is jetted from the drying gas jet nozzle 173, and the drying gas jet nozzle 173 moves along the wafer front face to the position P1 outside the end portion of the wafer W on the negative direction side in the Y-direction while jetting the air (FIG. 9C). Thereby, the cleaning solution A2 on the front face of the wafer W is blown away, whereby the wafer W is dried. During the drying, the blowout of gas from the gas blowout ports 130 is also continued so that the liquid leaked through the gap D is swept toward the rear face of the outer peripheral plate 140 and drained.

After finish of the drying of the wafer W, the drying gas jet nozzle 173 is returned to the nozzle waiting portion 175 and the blowout of gas from the gas blowout ports 130 is stopped. The wafer W is then passed from the chuck 120 to the second carrier unit 11 and carried out of the developing treatment unit 30, with which a series of developing treatment is completed.

According to the above embodiment, the outer peripheral plate 140 surrounds the outer peripheral portion of the wafer W to form the small gap D with respect to the outer peripheral portion of the wafer W, and the gas blowout ports 130 of the inner cup 123 can be used to form a gas flow flowing along the rear face of the rear face of the wafer W from the central portion side toward the outer peripheral portion side of the wafer W, so that liquid such as the developing solution A1 and the cleaning solution A2 leaking through the gap D can be drained after flowing along the rear face of the outer peripheral plate 140 outside the wafer W. Accordingly, the liquid never runs around to the rear face side of the wafer W, whereby the liquid can be prevented from adhering to the rear face of the wafer W.

Since the rear face of the horizontal portion 140a of the outer peripheral plate 140 has been hydrophilic treatment, the liquid leaking through the gap D easily flows along the rear face of the outer peripheral plate 140.

The front face of the horizontal portion 140a of the outer peripheral plate 140 is formed to be flush with the front face of the wafer W, so that the developing solution A1 can be accumulated over the front faces of the wafer W and the outer peripheral plate 140. This prevents the developing solution A1 from dropping down from the end portion of the wafer W and resultantly prevents the developing solution A1 from flowing during development, thereby allowing performance of uniform development within the wafer. Further, since the front face of the horizontal portion 140a has been subjected to hydrophobic treatment, the developing solution A1 on the outer peripheral plate 140 is prevented from diffusing outward and, for example, dropping from the end portion of the outer peripheral plate 140.

Figure 10:
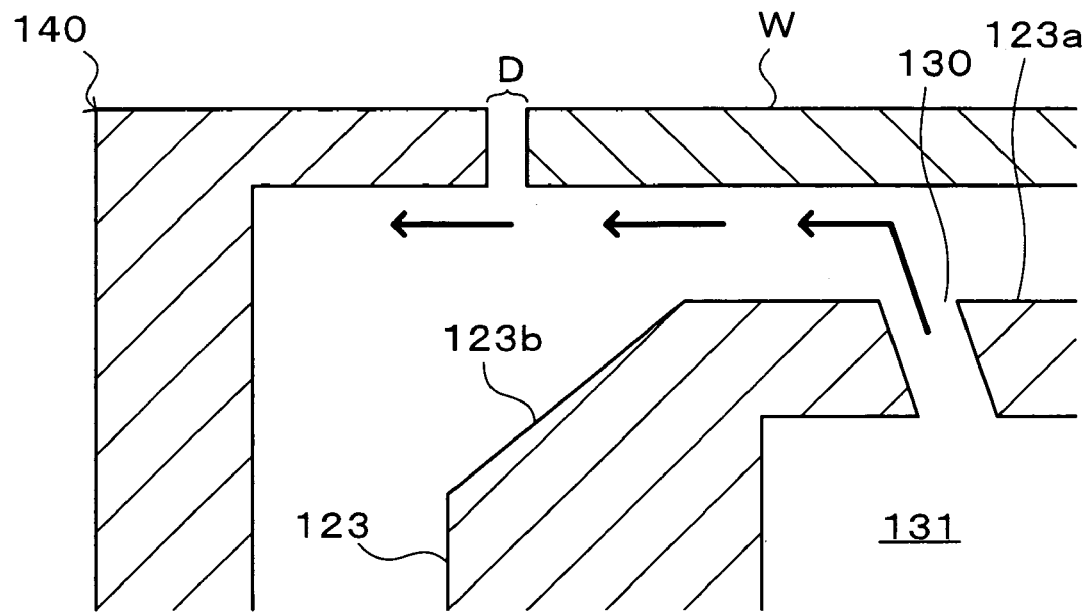
FIG. 10 is an explanatory view of a longitudinal section showing a configuration of an inner cup having obliquely formed gas blowout ports and an outer peripheral plate.
Figure 11:
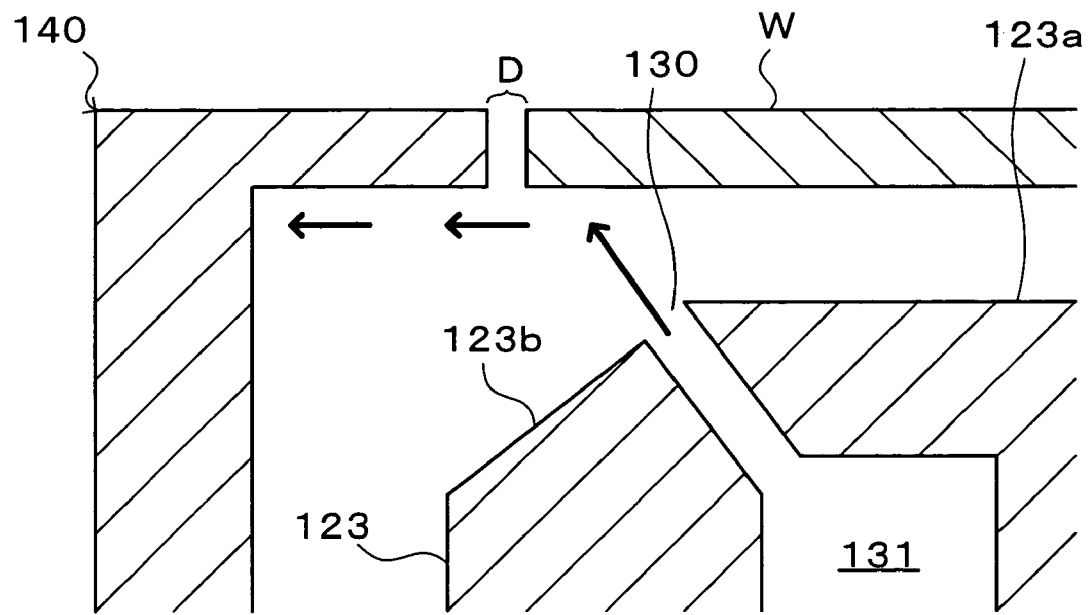
FIG. 11 is an explanatory view of a longitudinal section showing a configuration of an inner cup having gas blowout ports that blow gas directly to the outer peripheral portion of the wafer and an outer peripheral plate.

Although the gas blowout ports 130 are formed facing upward in the above-described embodiment, they may be formed facing obliquely upward, inclined to the outer peripheral portion side of the wafer W as shown in FIG. 10. In this case, the gas blown out from the gas blowout ports 130 smoothly flows in a direction toward the gap D, so that a strong gas flow can be effectively formed neat the gap D. Further, inclined gas blowout ports 130 as shown in FIG. 11 may be formed so that the gas can be blown directly to the outer peripheral portion of the wafer W. In this case, liquid can be effectively prevented from running around to the rear face of the outer peripheral portion side of the wafer W at the lower end portion of the gap D.

Figure 12:
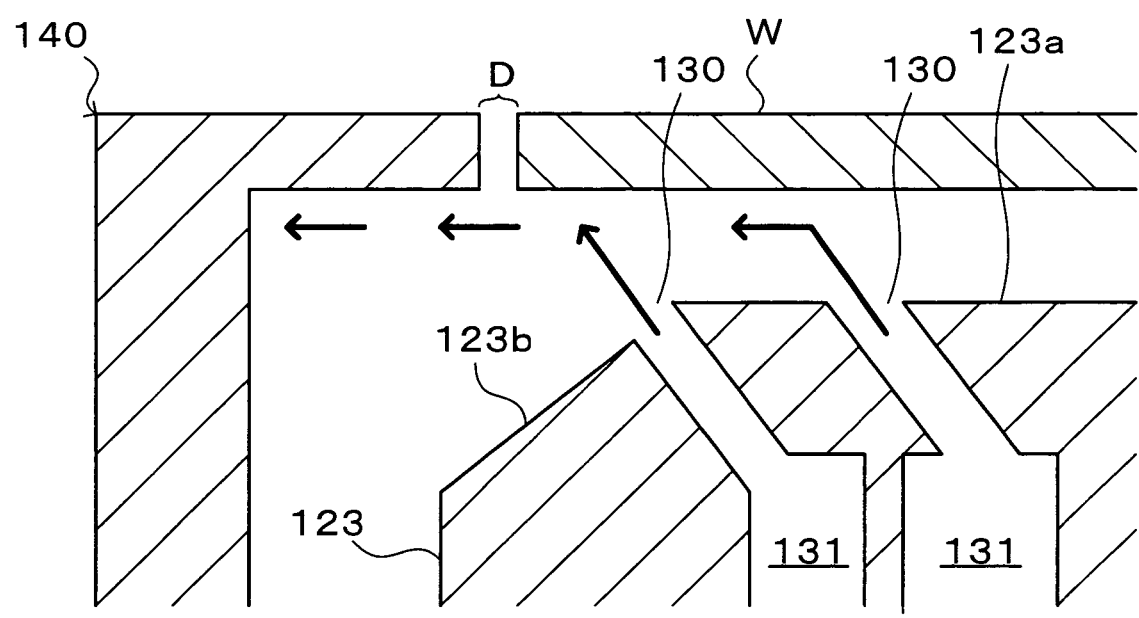
FIG. 12 is an explanatory view of a longitudinal section showing a configuration of an inner cup having double rows of gas blowout ports and an outer peripheral plate.

Further, the gas blowout ports 130 may be formed in double rows, an inner row and an outer row, as shown in FIG. 12. In this case, for example, the inner row and the outer row of gas blowout ports 130 are concentrically formed as seen in a plan view. Further, the buffer 131 is formed for each of the inner row and the outer row of gas blowout ports 130. The gas blowout ports 130 of the outer row are formed to blow the gas, for example, directly to the outer peripheral portion of the wafer W, while the gas blowout ports 130 of the inner row are formed to blow the gas to the inner side of the outer peripheral portion of the wafer W. In this case, the gas from the gas blowout ports 130 of the outer row can prevent the liquid leaking through the gap D from running around to the rear face side of the wafer W, and the gas from the gas blowout ports 130 of the inner row can prevent impurities such as mist existing therearound from flowing into the rear face side of the wafer W. Although the gas blowout ports 130 are formed in double rows, they may be formed in multiple rows such as triple rows or more.

Figure 13:
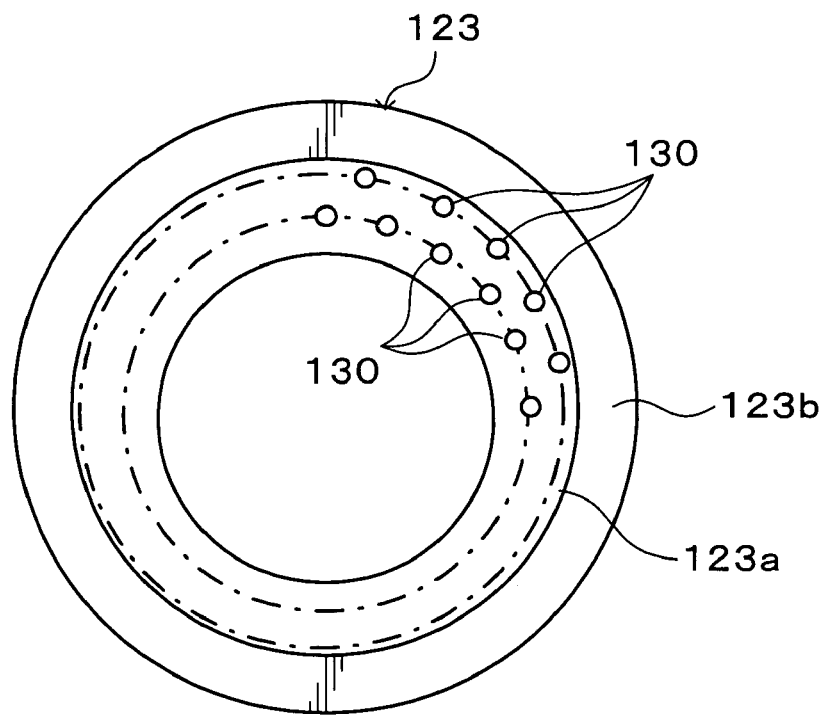
FIG. 13 is a plan view of an inner cup showing an arrangement example of gas blowout ports.
Figure 14:
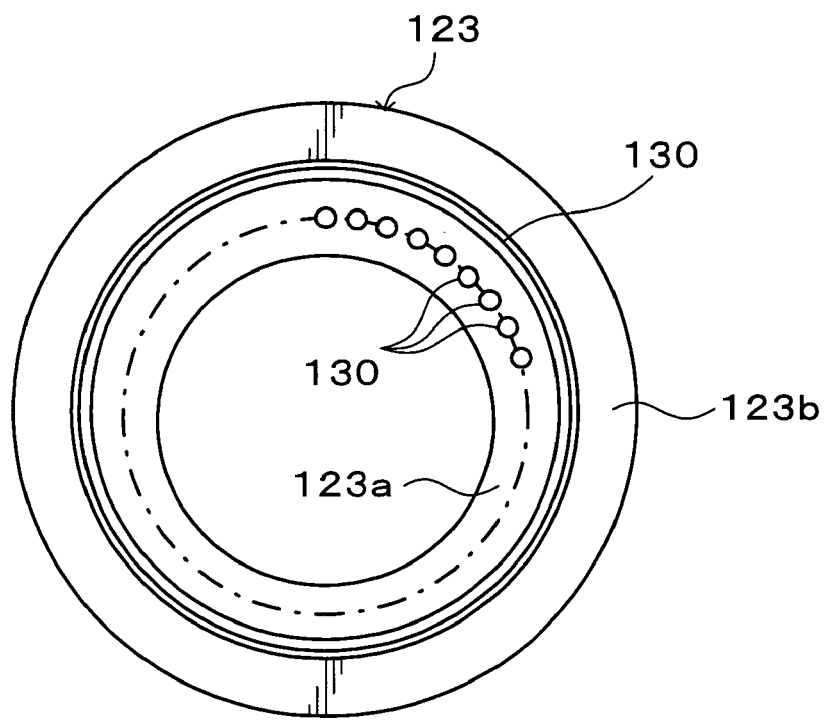
FIG. 14 is a plan view of an inner cup formed with a gas blowout port in a slit shape.

When the gas blowout ports 130 are formed in the inner row and the outer row, the gas blowout ports 130 of the outer row and the gas blowout ports 130 of the inner row may be arranged at alternate positions as shown in FIG. 13, namely, in such a manner that the gas blowout port 130 of the inner row is located between the gas blowout ports 130 of the outer row as seen from the radial direction. Alternatively, only the gas blowout ports 130 that blow the gas directly to the outer peripheral portion of the wafer W may be formed in a slit shape as shown in FIG. 14. In this case, a more uniform a gas flow can be formed over the entire outer peripheral portion of the wafer W.

Figure 15:
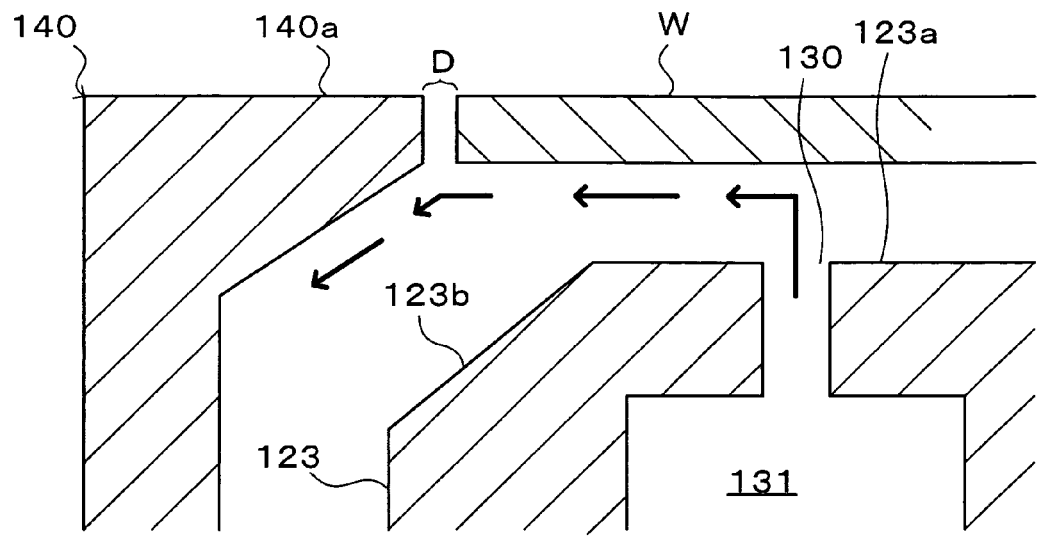
FIG. 15 is an explanatory view of a longitudinal section showing a configuration of an outer peripheral plate with an inclined rear face and an inner cup.

Although the rear face of the horizontal portion 140a of the outer peripheral plate 140 is horizontally formed in the above embodiment, it may be inclined to gradually lower toward the outside from a position of the lower end portion of the gap D as shown in FIG. 15. This form allows the liquid which has passed through the gap D to easily flow along the rear face of the outer peripheral plate 140. Note that the inclined angle of the rear face of the horizontal portion 140a is preferably about 10° to about 30°, more preferable not greater than 15°.

Figure 16:
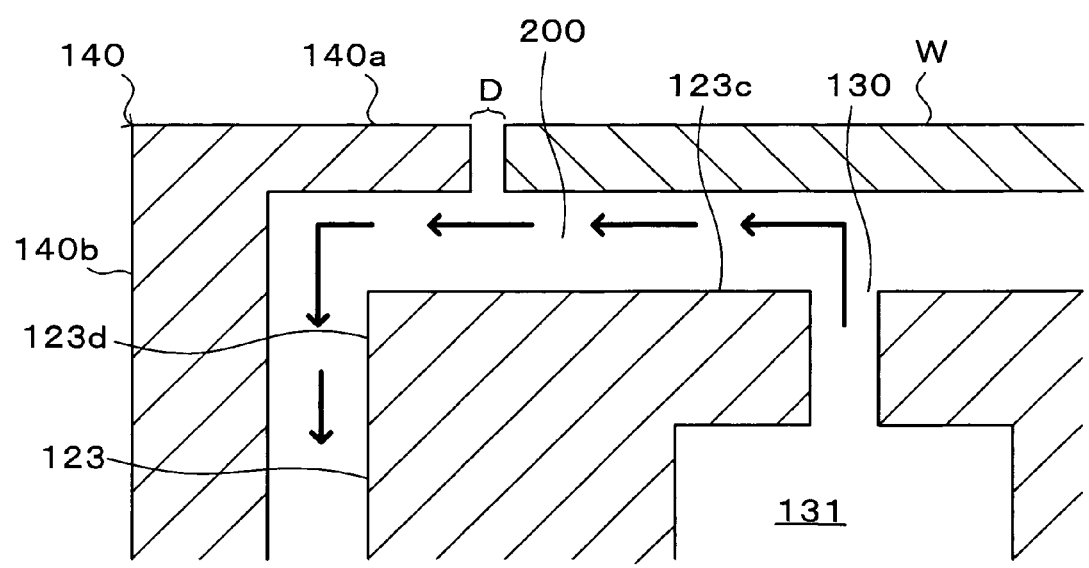
FIG. 16 is an explanatory view of a longitudinal section showing a configuration of an inner cup and an outer peripheral plate where a flow path is formed on the rear face of the wafer.

Alternatively, a flow path may be formed through which the gas blown out from the gas blowout ports 130 flows along the rear face of the wafer W and the rear face of the outer peripheral portion 140 as shown in FIG. 16. Namely, in the example shown in FIG. 16, an upper surface 123c of the inner cup 123 is horizontally formed to be parallel to the rear face of the wafer W and the rear face of the horizontal portion 140a of the outer peripheral plate 140, a side surface 123d of the inner cup 123 is vertically formed to be parallel to the inner surface of the vertical portion 140b of the outer peripheral plate 140, and a narrow flow path 200 is formed between the inner cup 123 and the wafer W and the outer peripheral plate 140. The flow path 200 leads to the collecting portion 125 of the cup 122. The width of the flow path 200 is set to, for example, about 0.5 mm that is about twice the width of the gap D. This arrangement forcibly causes the gas blown out from the gas blowout ports 130 to flow along the rear face of the wafer W and the rear face of the horizontal portion 140a of the outer peripheral plate 140, thereby forming a strong gas flow passing by the lower end portion side of the gap D toward the outside. Accordingly, the liquid leaking through the gap D can be more effectively swept outward and drained along the rear face of the outer peripheral plate 140.

Figure 17:
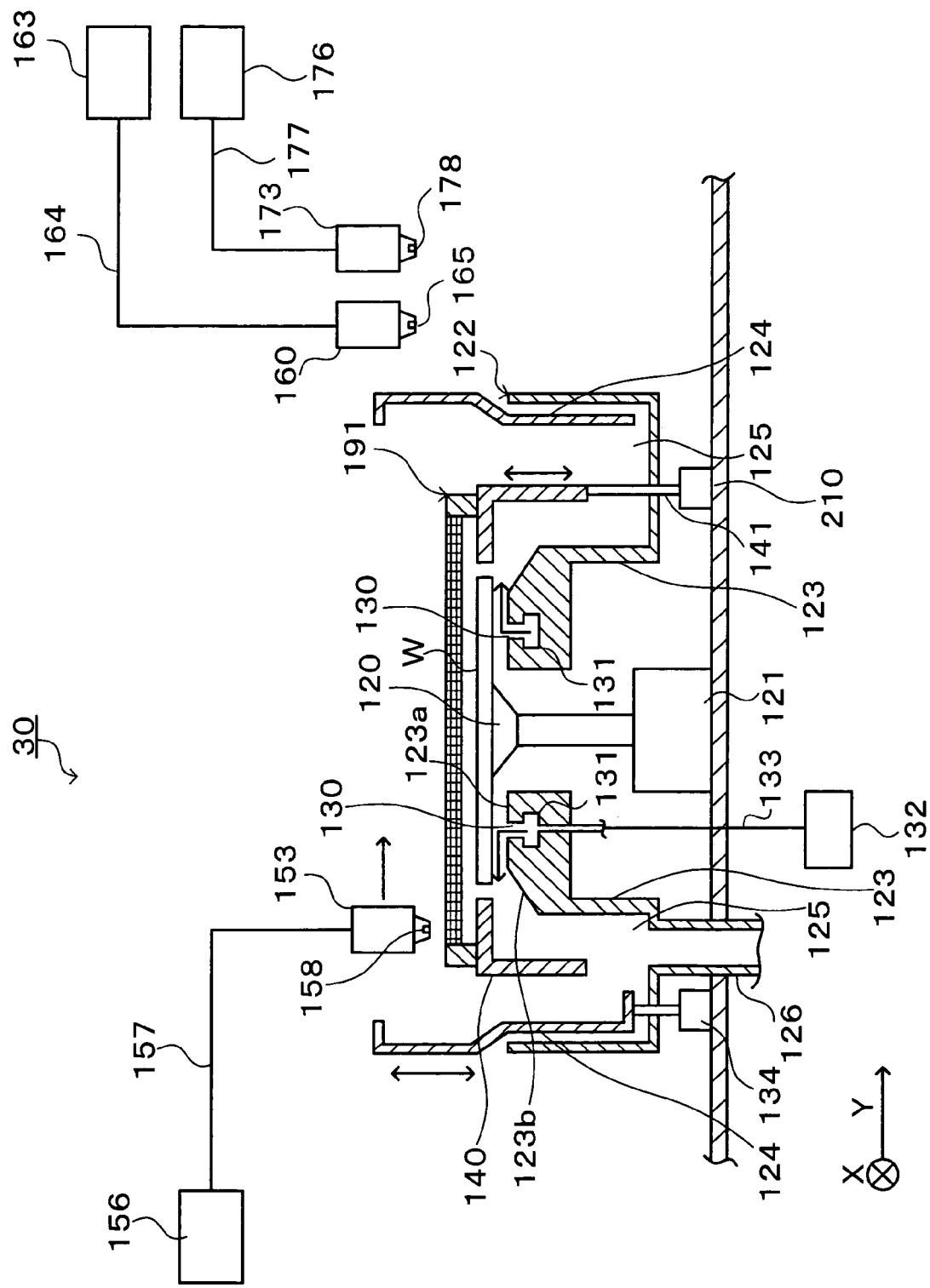
FIG. 17 is an explanatory view of a longitudinal section showing a schematic configuration of a developing treatment unit having a raising and lowering drive unit for the outer peripheral plate.
Figure 18:
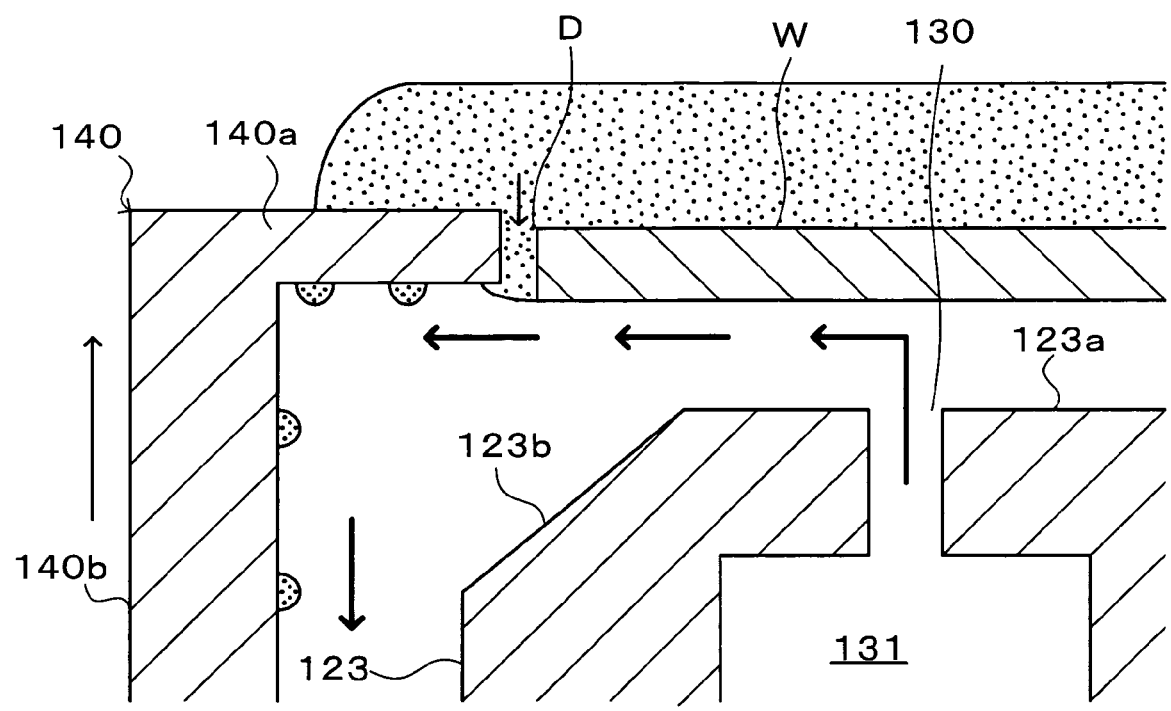
FIG. 18 is a longitudinal sectional view showing an outer peripheral plate whose vertical position is displaced with respect to the wafer and an inner cup.

The outer peripheral plate 140 illustrated in the above embodiment may be provided with a raising and lowering drive unit 210 composed of a cylinder or a motor as shown in FIG. 17. In this case, for example, when the cleaning solution A2 is supplied onto the wafer W using the cleaning solution supply nozzle 160 to clean the wafer W, the outer peripheral plate 140 is, for example, slightly raised as shown in FIG. 18 so that the wafer W and the outer peripheral plate 140 are displaced from each other in vertical position. The vertical positions of the wafer W and the outer peripheral plate 140 are set in an appropriate relation, whereby the liquid leaking through the gap D between the wafer W and the outer peripheral plate 140 easily flows along the rear face of the outer peripheral plate 140 and is appropriately drained. Note that the appropriate positional relationship between the outer peripheral plate 140 and the wafer W in this case differs depending on the physical property of the liquid and the width of the gap D, and is thus obtained from an experiment or the like in advance.

Although examples of the embodiment of the present invention have been described above, the present invention is not limited to the examples but can take various forms. For example, the embodiment is a non-rotational type developing treatment unit, and the present invention may be applied to a rotational type developing treatment unit. Even in the rotational type developing treatment unit, the above-described outer peripheral plate 140 and the gas blowout ports 130 can be provided to prevent liquid from running around to the rear face side of the wafer W. Further, the cleaning solution supply nozzle 160 and the drying gas jet nozzle 173 are separate nozzles in this embodiment, but they may be an integrated nozzle. While the developing treatment unit for the wafer W has been described, the present invention is also applicable to a developing treatment unit for substrates other than the wafer such as an FPD (Flat Panel Display), a mask reticule for a photomask, and so on.

The present invention is useful for preventing liquid from running around to the rear face side of the substrate during the developing treatment.

What is claimed is:

1. A developing treatment apparatus for performing a developing treatment for a substrate, comprising:
    a substrate holding member for holding the substrate;
    a cup provided around said substrate holding member for receiving liquid splashing from the substrate;
    an outer peripheral plate surrounding an outer peripheral portion of the substrate held on said substrate holding member to form a gap between said plate and the outer peripheral portion of the substrate; and
    gas blowout ports for forming a gas flow which flows on a rear face of the substrate held on said substrate holding member, from a central portion side of the substrate to the outer peripheral portion side of the substrate, and passes by a lower end portion side of the gap;
    wherein said outer peripheral plate has a horizontal portion and a vertical portion,
    further wherein a front face of the horizontal portion is placed flush with the front face of the substrate held on said substrate holding member, and the horizontal portion has a same thickness as a thickness of the substrate, and
    further wherein the vertical portion is located in said cup.

2. The developing treatment apparatus as set forth in claim 1, wherein the gap between said outer peripheral plate and the outer peripheral portion of the substrate has a width set such that a liquid which has passed through the gap from a front face side of the substrate flows along a rear face of said outer peripheral plate.

3. The developing treatment apparatus as set forth in claim 1, wherein a rear face of said outer peripheral plate has been subjected to hydrophilic treatment.

4. The developing treatment apparatus as set forth in claim 1, wherein said gas blowout ports are formed to blow out a gas in an obliquely upward direction which is a direction inclined from the upward direction toward the outer peripheral portion side of the substrate.

5. The developing treatment apparatus as set forth in claim 4, wherein said gas blowout ports are formed to blow the gas directly to the outer peripheral portion of the substrate.

6. The developing treatment apparatus as set forth in claim 4, wherein said gas blowout ports are formed in multiple rows concentrically on the rear face side of the substrate.

7. The developing treatment apparatus as set forth in claim 6, wherein said gas blowout ports of an outer row of said gas blowout ports of the multiple rows are formed to blow the gas directly to the outer peripheral portion of the substrate.

8. The developing treatment apparatus as set forth in claim 1, further comprising: a raising and lowering drive unit for raising and lowering said outer peripheral plate.

9. The developing treatment apparatus as set forth in claim 1, wherein a rear face of said outer peripheral plate is inclined in a manner to gradually lower to the outside from a portion forming the lower end portion of the gap.

10. The developing treatment apparatus as set forth in claim 1, wherein a flow path is formed on the rear face side of the substrate that allows a gas blown out from said gas blowout ports to flow along the rear face of the substrate and a rear face of said outer peripheral plate.

11. The developing treatment apparatus as set forth in claim 1, wherein the front face of said outer peripheral plate has been subjected to hydrophobic treatment.

12. A developing treatment apparatus for performing a developing treatment for a substrate, comprising:
a substrate holding member for holding the substrate;
an outer peripheral plate surrounding an outer peripheral portion of the substrate held on said substrate holding member to form a gap between said plate and the outer peripheral portion of the substrate; and
gas blowout ports for forming a gas flow which flows on a rear face of the substrate held on said substrate holding member, from a central portion side of the substrate to the outer peripheral portion side of the substrate, and passes by a lower end portion side of the gap;
wherein the gap has a width of a size such that a liquid placed on the gap never drops down through the gap solely due to a liquid's own weight.

13. The developing treatment apparatus as set forth in claim 1, wherein said gas blowout ports are circularly arranged on an upper surface of an inner cup located on the rear face side of the substrate.

14. The developing treatment apparatus as set forth in claim 13, wherein said gas blowout ports communicate with a buffer formed in a ring shape inside the inner cup.

15. The developing treatment apparatus as set forth in claim 12, wherein the gap between said outer peripheral plate and the outer peripheral portion of the substrate has a width set such that a liquid which has passed through the gap from a front face side of the substrate flows along a rear face of said outer peripheral plate.

16. The developing treatment apparatus as set forth in claim 12, wherein a rear face of said outer peripheral plate has been subjected to hydrophilic treatment.

17. The developing treatment apparatus as set forth in claim 12, wherein said gas blowout ports are formed to blow out a gas in an obliquely upward direction which is a direction inclined from the upward direction toward the outer peripheral portion side of the substrate.

18. The developing treatment apparatus as set forth in claim 17, wherein said gas blowout ports are formed to blow the gas directly to the outer peripheral portion of the substrate.

19. The developing treatment apparatus as set forth in claim 17, wherein said gas blowout ports are formed in multiple rows concentrically on the rear face side of the substrate.

20. The developing treatment apparatus as set forth in claim 19, wherein said gas blowout ports of an outer row of said gas blowout ports of the multiple rows are formed to blow the gas directly to the outer peripheral portion of the substrate.

21. The developing treatment apparatus as set forth in claim 12, further comprising: a raising and lowering drive unit for raising and lowering said outer peripheral plate.

22. The developing treatment apparatus as set forth in claim 12, wherein a rear face of said outer peripheral plate is inclined in a manner to gradually lower to the outside from a portion forming the lower end portion of the gap.

23. The developing treatment apparatus as set forth in claim 12, wherein a flow path is formed on the rear face side of the substrate that allows a gas blown out from said gas blowout ports to flow along the rear face of the substrate and a rear face of said outer peripheral plate.

24. The developing treatment apparatus as set forth in claim 12, wherein a front face of said outer peripheral plate is placed flush with a front face of the substrate held on said substrate holding member.

25. The developing treatment apparatus as set forth in claim 24, wherein the front face of said outer peripheral plate has been subjected to hydrophobic treatment.

26. The developing treatment apparatus as set forth in claim 12, wherein said gas blowout ports are circularly arranged on an upper surface of an inner cup located on the rear face side of the substrate.

27. The developing treatment apparatus as set forth in claim 26, wherein said gas blowout ports communicate with a buffer formed in a ring shape inside the inner cup.

* * * * *